United States Patent [19]
Suzuki et al.

[11] Patent Number: 5,078,141
[45] Date of Patent: Jan. 7, 1992

[54] METHOD AND SYSTEM FOR ACQUIRING IMAGE REPRESENTING BRAIN SURFACE ANATOMY

[75] Inventors: Hirokazu Suzuki, Ootawara; Yoshio Machida; Masahiko Hatanaka, both of Tochigi, all of Japan

[73] Assignee: Kabushiki Kaisha Toshiba, Kawasaki, Japan

[21] Appl. No.: 697,498

[22] Filed: May 3, 1991

Related U.S. Application Data
[63] Continuation of Ser. No. 343,635, Apr. 27, 1989, abandoned.

[30] Foreign Application Priority Data

| Apr. 29, 1988 | [JP] | Japan | 63-105959 |
| Apr. 29, 1988 | [JP] | Japan | 63-105960 |
| Jun. 17, 1988 | [JP] | Japan | 63-148247 |

[51] Int. Cl.⁵ ............................................. A61B 5/55
[52] U.S. Cl. ............................... 128/653.2; 324/309; 324/318
[58] Field of Search ............. 128/653 A; 324/309, 324/318, 319, 322, 320

[56] References Cited

U.S. PATENT DOCUMENTS

| 4,581,582 | 4/1986 | Redington | 324/309 |
| 4,710,876 | 12/1987 | Cline et al. | 340/727 |
| 4,761,613 | 8/1988 | Hinks | 324/309 |
| 4,774,468 | 9/1988 | Bydder | 128/653 SC |
| 4,812,761 | 3/1989 | Vaughan, Jr. | 324/307 |

Primary Examiner—Lee S. Cohen
Assistant Examiner—Krista M. Pfaffle
Attorney, Agent, or Firm—Finnegan, Henderson, Farabow, Garrett, and Dunner

[57] ABSTRACT

In an MRI system, in order to acquire an MR image representing a brain surface anatomy of a head of a subject, a surface coil is disposed near the head of the subject, and a predetermined pulse sequence by a spin echo method, a field echo method, or the like is performed. A view direction is changed for a single slice, and an MR image based on stereoscopic viewing is obtained by a single scan. Regions of interest are set on the brain surface portion on the MR image, and then a predetermined pulse sequence is using an echo time for inhibiting mr signals from fat of the brain surface and using a pulse repetition time for enhancing mr signals from water of the brain surface in order performed to obtain projection data in a direction of depth, thereby allowing accurate grasping of the position of a disease portion.

14 Claims, 13 Drawing Sheets

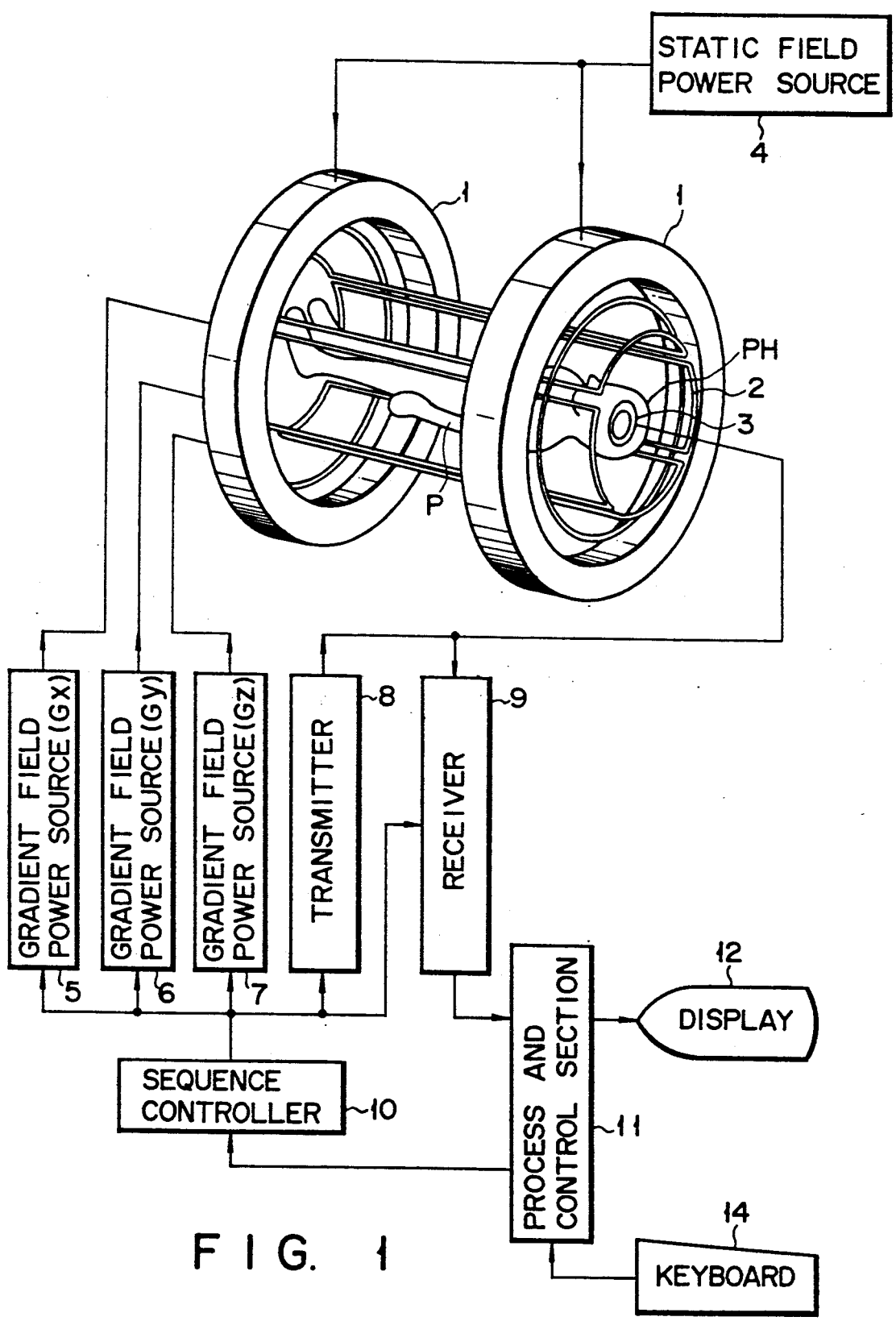
F I G. 1

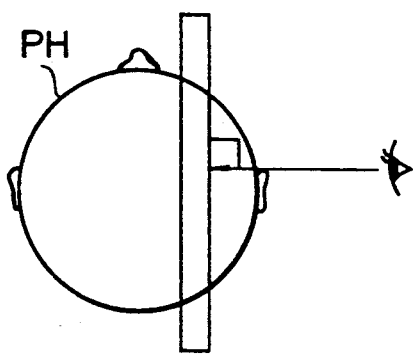
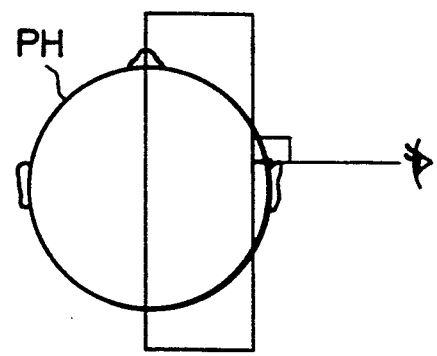
F I G. 8A    F I G. 8B
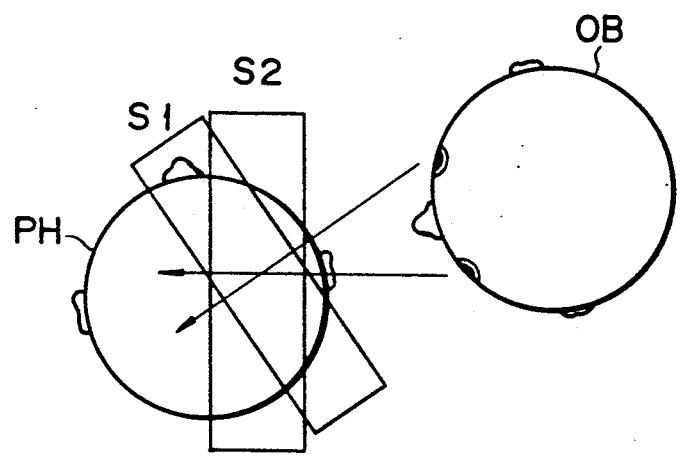
F I G. 9
F I G. 10A    F I G. 10B

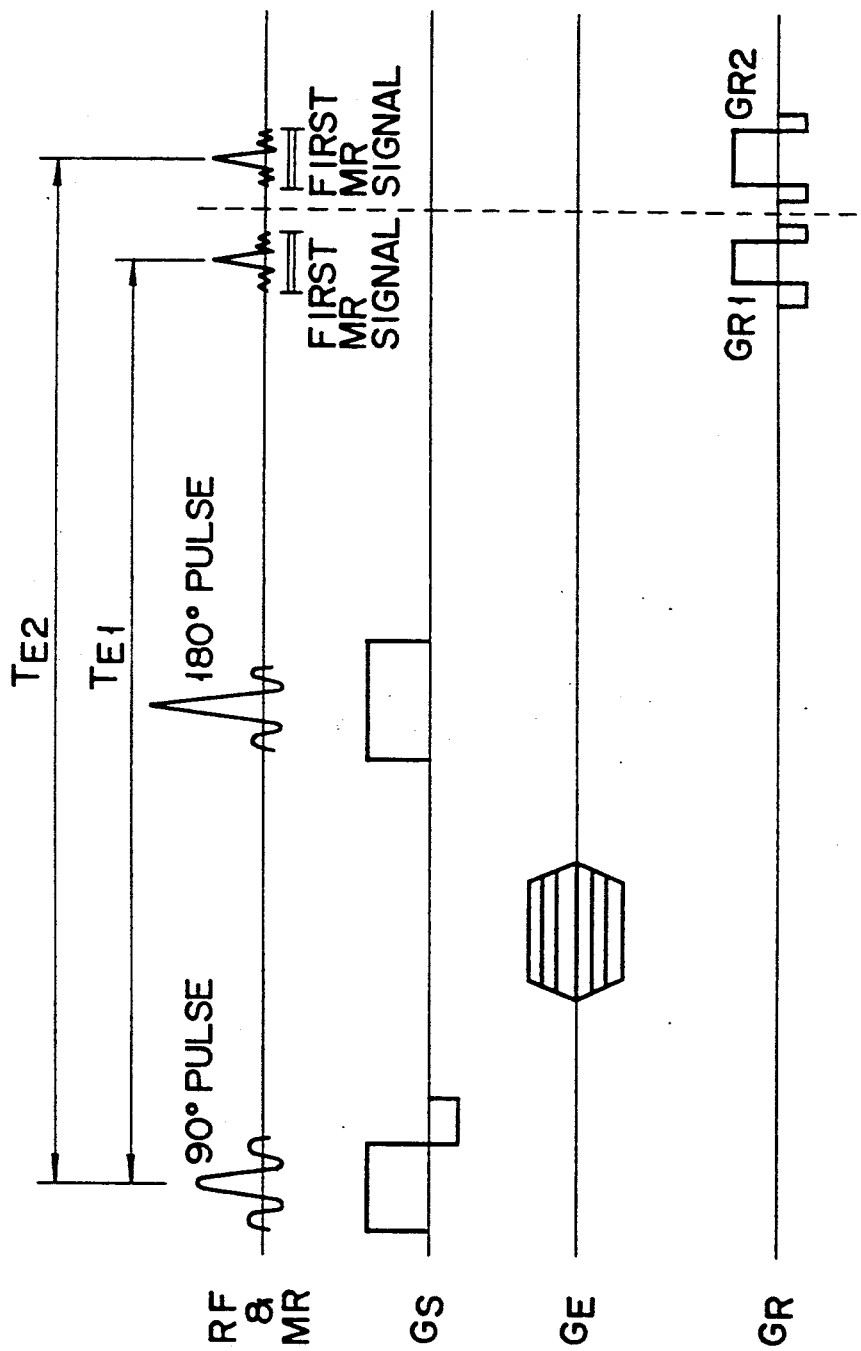
F I G. 13

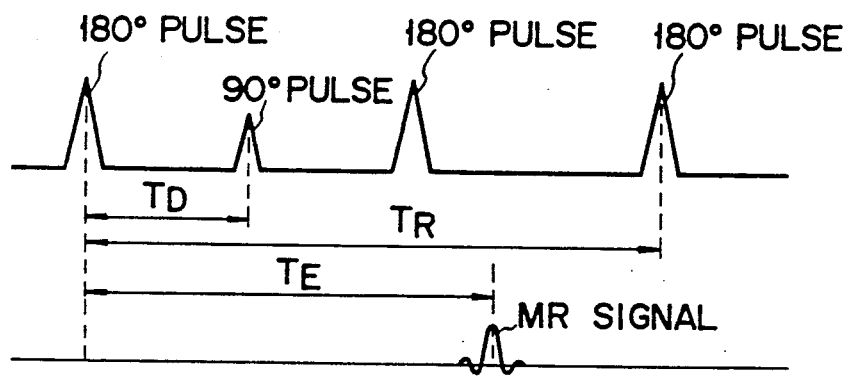
F I G. 15
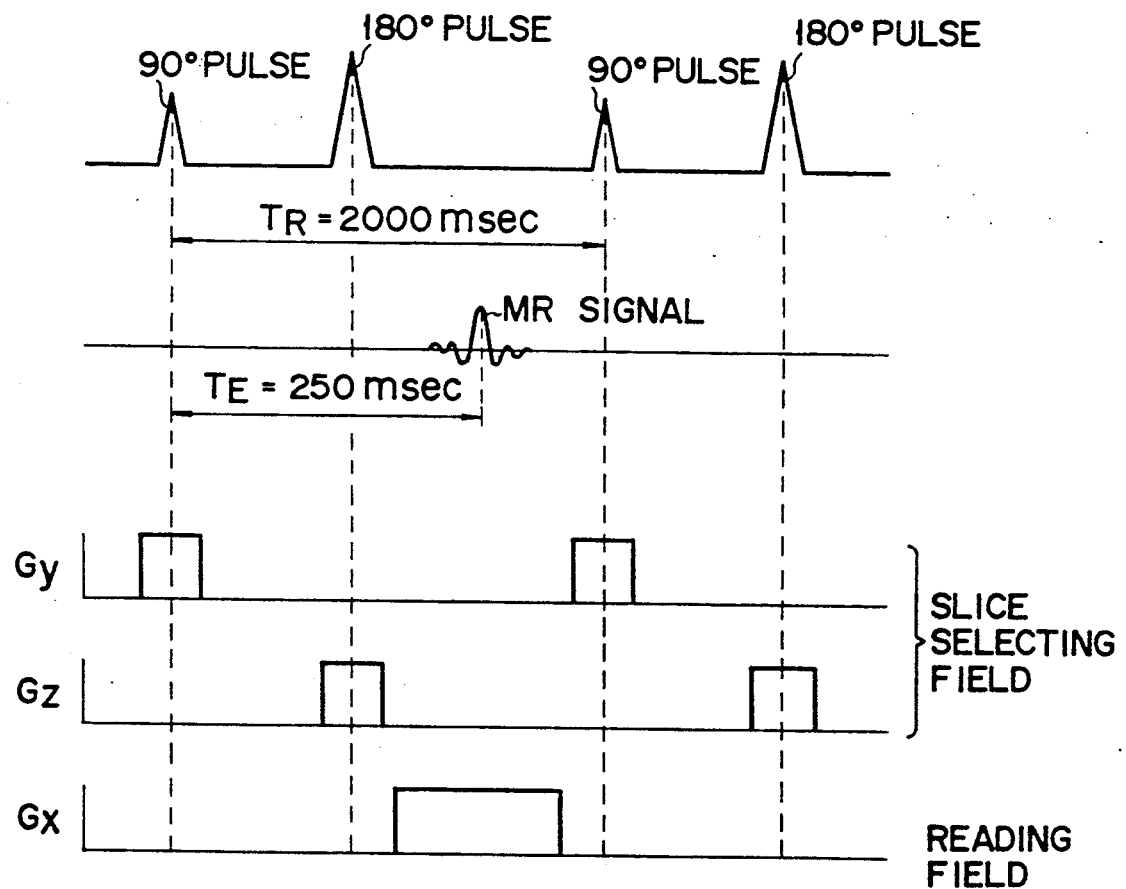
F I G. 20

METHOD AND SYSTEM FOR ACQUIRING IMAGE REPRESENTING BRAIN SURFACE ANATOMY

This application is a continuation of application Ser. No. 07/343,635, filed Apr. 27, 1989, now abandoned.

BACKGROUND OF THE INVENTION

1. Field of the Invention

The present invention relates to a method of acquiring an image representing a brain surface anatomy and a system for practicing the method.

2. Description of the Related Art

In a magnetic resonance (MR) phenomenon, an atomic nucleus having a magnetic moment and placed in a static field absorbs or emits an electromagnetic wave having a specific frequency by resonance. A resonance frequency (Lamor frequency) $\nu_0$ of the atomic nucleus is represented by the following equation:

$$\nu_0 = \gamma H_0 / 2\pi \tag{1}$$

where $\gamma$ is the magnetogyric ratio unique to the type of atomic nucleus, and $H_0$ is the strength of a static field.

An apparatus for diagnosing the inside of a subject by utilizing the MR phenomenon detects an electromagnetic wave generated inside the subject and processes the electromagnetic wave as an MR signal. A slice image of the subject which includes an atomic nucleus density, a longitudinal relaxation time T1, a lateral relaxation time T2, a flow, and a chemical shift can be noninvasively obtained. The MR signal can be obtained by exciting the entire subject placed in the static field. However, in practice, a predetermined portion of the subject is excited to obtain the MR signal due to structural limitations of the apparatus and clinical requirements.

In a surgical treatment for a disease within a cranium, it is very important to acquire an image representing an anatomy of a brain surface such as brain grooves or the like in order to grasp the position of a local cortical or subcortical disease portion. For this reason, images are acquired by MRI. For example, when a head coil having a shape for surrounding a head of a subject is used, images including subcortical information are obtained since an MR signal for the entire head is acquired. When a surface coil is used, many MR signals from the subcutaneous fat and the like of the surface layer are obtained by sensibility characteristics (highly sensible to signals from a portion near the coil) of the coil. Therefore, it is difficult to accurately grasp the position of a local cortical or subcortical disease portion in the head.

Strong demand therefore has arisen for an apparatus capable of acquiring a brain surface anatomy in order to accurately grasp the positions of disease portions located on the brain surface of the head of the subject.

SUMMARY OF THE INVENTION

It is an object of the present invention to provide a method of acquiring an image representing a brain surface anatomy and a system for practicing the method.

According to one aspect of the present invention, there is provided a method for acquiring an image representing a brain surface anatomy of a subject in a magnetic resonance imaging apparatus, the method comprising the steps of: arranging a surface coil near a head of the subject; executing a predetermined pulse sequence for selecting magnetic resonance signals from water inside the head, thereby applying a static magnetic field, gradient magnetic fields, and a radio frequency pulse; detecting the magnetic resonance signals from water by using the surface coil in accordance with the predetermined pulse sequence; and acquiring the image representing the brain surface anatomy of the subject by constructing the image from the detected magnetic resonance signals.

According to another aspect of the present invention, there is provided a system for acquiring an image representing a brain surface anatomy inside a head of a subject, in a magnetic resonance imaging apparatus, the system comprising: static magnetic field applying means for applying a static magnetic field to the subject; gradient magnetic field applying means for applying gradient magnetic fields to the subject; surface coil means for transmitting a radio frequency pulse to the subject and detecting magnetic resonance signals from the subject, the surface coil means arranged near the head of the subject; pulse sequence control means for controlling the static magnetic field generating means, the gradient magnetic field generating means and the surface coil means in accordance with a predetermined pulse sequence, the predetermined pulse sequence being executed for selecting the magnetic resonance signals from water inside the head; and processing means for processing the magnetic resonance signals detected by the surface coil means in accordance with the pulse sequence control means, thereby acquiring the image representing the brain surface anatomy.

BRIEF DESCRIPTION OF THE DRAWINGS

FIG. 1 is a view showing an arrangement of an MRI system;

FIGS. 8A and 8B are views showing the relationship between the slice position and the view direction for the subject;

FIG. 9 is a view showing slice positions to obtain a stereoscopic image;

FIGS. 10A and 10B show MR images at the slice positions shown in FIG. 9;

FIG. 13 is a view showing a pulse sequence by the spin echo method on the basis of the view direction shown in FIG. 11;

FIG. 15 is a view showing a pulse sequence by an inversion recovery method;

FIG. 20 is a view showing a pulse sequence for obtaining projection data;

DETAILED DESCRIPTION OF THE PREFERRED EMBODIMENT

Figure 2:
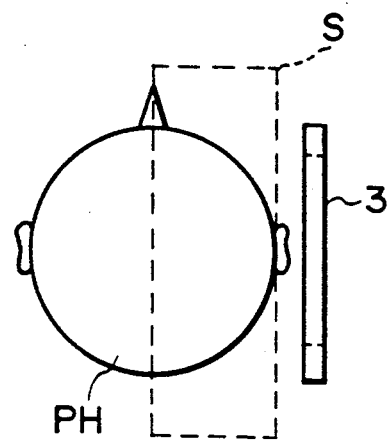
FIG. 2 is a view showing a surface coil layout.

A preferred embodiment of the present invention will be described in detail with reference to the accompanying drawings.

In an MRI system shown in FIG. 1, a magnet assembly capable of arranging a subject P therein comprises normal conductive or superconductive coils (correction shim coils may be set thereto) 1 for generating a static magnetic field, coils 2 for generating X-, Y-, and Z-axis gradient magnetic fields to position information to a predetermined portion of the subject P in which an MR signal is generated, and a surface coil 3 for transmitting an RF pulse and detecting an MR signal. The surface coil 3 is located near the head PH of the subject P. The surface coil 3 may be used to detect only the MR signal, and transmission of an RF pulse may be performed by another coil. Permanent magnets may be used in place of the coils 1 to generate a static field.

If the MRI system includes the superconductive coils 1, the system also includes a static field power source 4 having a cooling unit, a transmitter 8 for controlling transmission of RF pulses, a receiver 9 for controlling reception of an MR signal, gradient field power sources 5, 6, and 7 for supplying currents to the coils 2, a sequence controller 10 for executing a pulse sequence (to be described later), a process and control section 11 for controlling the controller 10 and processing the received MR signal, a display 12, and a keyboard 14.

In the above system, an RF pulse is applied from the transmitter 8 to the coil 3. Gradient fields $G_x$, $G_y$, and $G_z$ are generated by the gradient field power sources 5, 6, and 7 and applied from the coils 2 to the subject P. The gradient fields $G_x$, $G_y$, and $G_z$ are used to provide slicing, phase encoding, and read gradient fields. The MR signal from the predetermined portion of the head PH of the subject P is detected by the surface coil 3. The above sequence is repeated a plurality of times to obtain MR data, thereby reconstructing an MR image on the basis of the MR data.

The general pulse sequence in MRI will be described below.

Figure 3:
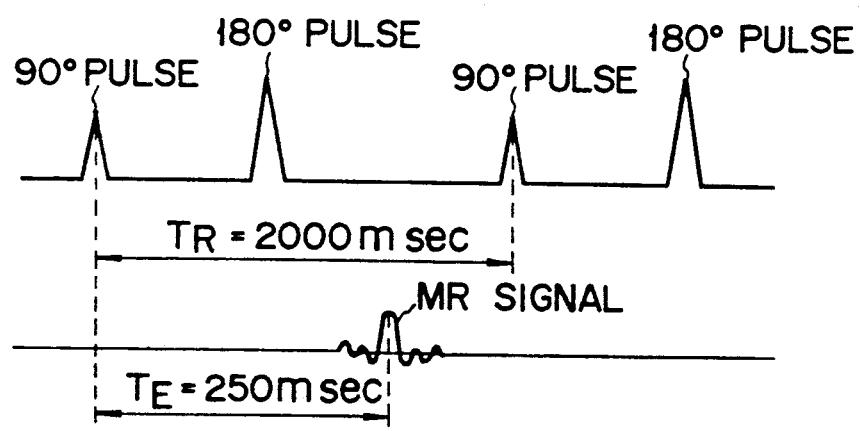
FIG. 3 is a view showing a pulse sequence by a spin echo method.

As shown in FIG. 2, the surface coil 3 is located near the head PH of the subject P. The pulse sequence is executed by a spin echo (SE) method shown in FIG. 3. A 90° pulse and a slicing gradient field are applied to the subject P. Gradient field conditions, i.e., a ratio of the gradient fields $G_x$, $G_y$, and $G_z$, are set such that almost half of the head serves as a slice portion. A 180° pulse, a phase encoding gradient field and a read gradient field are applied to the head PH of the subject P. An echo time $T_E$ is set to be 250 msec (normally 100 msec) to obtain an MR signal shown in FIG. 3. A pulse repetition time $T_R$ is set to be 2,000 msec (normally, 1,000 msec or less to repeat the pulse sequence.

Magnetization of water can be sufficiently recovered during the above pulse repetition time $T_R$, and the intensity of the MR signal from water of the brain grooves is increased. The MR signal from the fat on the surface layer of the head PH can be suppressed by an echo time $T_E$ of 250 msec.

Figure 4:
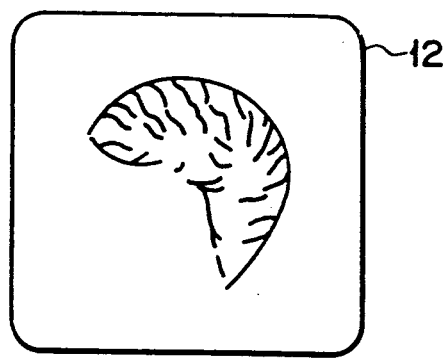
FIG. 4 is a view showing a display example of an HR image.

Brain grooves are displayed on the display 12 without overlapping other portions by the above-mentioned SAS (Surface Anatomy Scan), as shown in FIG. 4. Therefore, a medical image clearly representing a positional relationship between the brain surface and disease portions can be obtained.

Another pulse sequence for acquiring an HR image representing a brain surface will be described with reference to FIG. 5.

Figure 5:
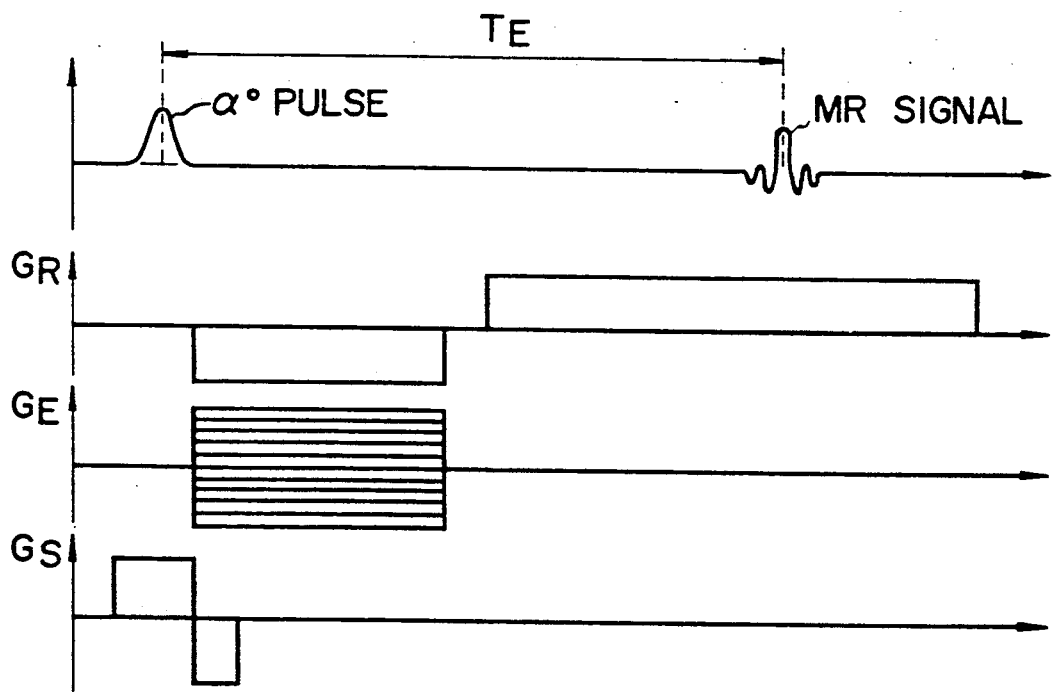
FIG. 5 is a view showing a pulse sequence by a field echo method.

As shown in FIG. 5, an MR signal is obtained by a field echo method for performing inversion of a gradient field in place of application of the 180° pulse in the spin echo method. A slice is set to be about 8 cm, which is larger than a conventional slice. The echo time $T_E$ is set to be 22 msec or more (normally, 14 msec or less , and the pulse repetition time $T_R$ is 100 msec or more (normally, 50 msec or less). Reference symbol $G_S$ denotes a slicing gradient field $G_R$, a read gradient field and $G_E$, a phase encoding gradient field.

Figure 6:
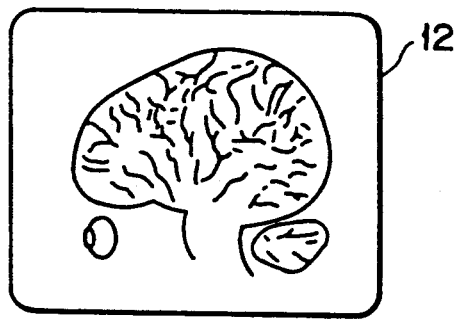
FIG. 6 shows another display example of an MR image.

Under these conditions, an α° pulse is applied to the subject by the coil 3, and the gradient field $G_S$ is applied by the coil 2. The gradient fields $G_R$ and $G_E$ are then applied to the subject by the coil 2. An MR signal from the slice portion of the head PH of the subject P is acquired by the surface coil 3 in the echo time $T_E$. By repeating this pulse sequence a predetermined number of times, MR data are acquired to reconstruct an MR image. Therefore, an MR image shown in FIG. 6 is displayed on the display 12 in the same manner as in the image of FIG. 4.

According to the above pulse sequence, magnetization of water is almost recovered within the pulse repetition time $T_R$ of 100 msec. Therefore, an intensity of the MR signal from the water of the slice portion is increased. When an echo time $T_E$ (22 msec) longer than the normal echo time is set, the MR signal from the fat of the surface layer can be suppressed.

As described above, the MR signal can be obtained from water of the brain grooves. Since the coil 3 having a higher sensibility in a direction immediately below the coil position is used, the MR signal from a deep portion can be suppressed. In addition, since the echo time $T_E$ is set to be longer than the normal echo time, the MR signal from the fat of the surface layer and greatly attenuated by the lateral relaxation time $T_2$ can be suppressed. Therefore, the brain grooves are displayed on the display 12 without overlapping the other portions, thereby clarifying the positional relationship between the brain surface and the disease portions. In this case, since the field echo method having a pulse repetition time $T_R$ shorter than that of the spin echo method is used, the MR data acquisition time (scan time) can be shortened.

The MR signal from the fat can also be suppressed by a field echo method using a chemical shift between the water and fat to set directions of magnetization of the water and fat to be 90° (i.e., the direction of magnetization of the water is perpendicular to that of the fat), or 180° (i.e., the direction of magnetization of the water is opposite to that of the fat), thereby obtaining the same effect as described above. More specifically, when a static field is set to be 0.5 tesla, a resonance frequency of proton is 21.3 MHz, and a chemical shift between the water and fat is 3.5 ppm. When the echo time $T_E$ is set to be 16.8 msec, an angle formed between the directions of magnetization of the water and fat is 90°. When the echo time $T_E$ is set to be 20.1 msec, the angle is 180°. Other gradient field echo pulse sequences, for example FISP, CEFAST and SSFP methods, can provide SAS images.

Figure 7:
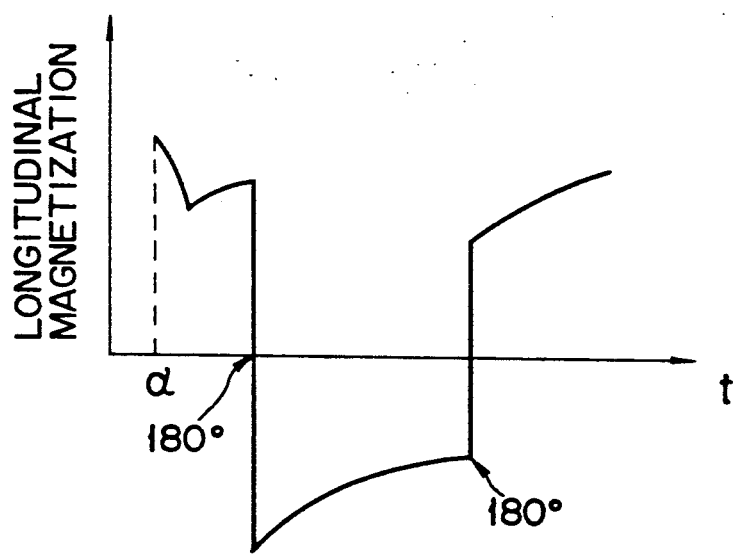
FIG. 7 is a view showing a change in longitudinal magnetization.

A spin echo method of acquiring a second MR signal may be used in a pulse sequence of an $\alpha$ ($\alpha < 90°$), a 180° pulse, and a 180° pulse. More specifically, as shown in FIG. 7, an angle of the first RF pulse is set to be smaller than 90° to acquire an MR signal upon application of the third RF pulse, thereby increasing the magnitude of longitudinal magnetization and hence reducing the influence of the longitudinal relaxation time $T_1$. The MR signal from the fat can be suppressed in the same manner as in the above embodiment. In this case, the time period required for restoring a thermally equilibrium state of magnetization can be shortened. Accordingly, the pulse repetition time $T_R$ can be set to be about 500 to 600 msec.

When an MR signal is acquired by the above method, since a slicing direction, a read direction, and a phase encoding direction for the subject use three orthogonal axes, i.e., the X-, Y-, and Z-axis, the slice portion is perpendicular to a view direction for actually observing the subject, as shown in FIGS. 8A and 8B. This orthogonal relationship is kept unchanged even if the slice portion is thin (FIG. 8A) or thick (FIG. 8B).

As a distance of about several cm is present between both eyes of an observer OB, a slice portion of the head PH of the subject P are generally extracted by setting a slice S1 for the right eye and a slice S2 for the left eye.

When the position of the slice S1 is different from that of the slice S2, an MR image acquired from the slice portion of the subject is a composite image of an image G1 corresponding to the slice S1 and an image G2 corresponding to the slice S2, as shown in FIGS. 10A and 10B. The resultant MR image is not a stereoscopic image obtained by observing a single slice portion. In this case, since scanning is performed for both the slices S1 and S2, the scan time is increased.

Figure 11:
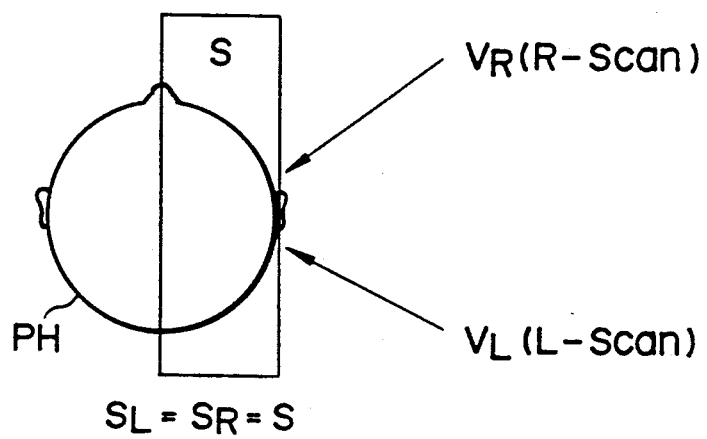
FIG. 11 is a view showing a stereoscopic view direction of the subject according to an embodiment of the present invention.

Referring to FIG. 11, assume that a scan based on the right eye of the observer OB is defined as an R-scan, a scan based on the left eye of the observer OB is defined as an L-scan, a slice subjected to the R-scan is defined as $S_R$, a slice subjected to the L-scan is defined as $S_L$, a view direction of the right eye is defined as $V_R$, and a view direction of the left eye is defined as $V_L$. Although $S_R = S_L (= S)$, a slice S of the head PH of the subject P and a view direction V ($V_R$ or $V_L$) for the slice S are determined by a pulse sequence. That is, the slice S is determined by the directions of the slicing gradient field $G_S$, the read gradient field $G_R$, and the phase encoding gradient field $G_E$ applied to the subject P.

The slice S is perpendicular to the direction of the gradient field $G_S$. A plane $<G_R, G_E>$ formed by the view direction V and the gradient fields $G_R$ and $G_E$ has the following relation:

$$V < ^c G_R, G_E > \qquad (2)$$

A symbol $\perp$ represents an orthogonal relationship. Since $G_S \perp G_R$, $G_S \perp G_E$, and $G_R \perp G_E$ are given, the direction of the slice S is perpendicular to the view direction V.

Figure 12:
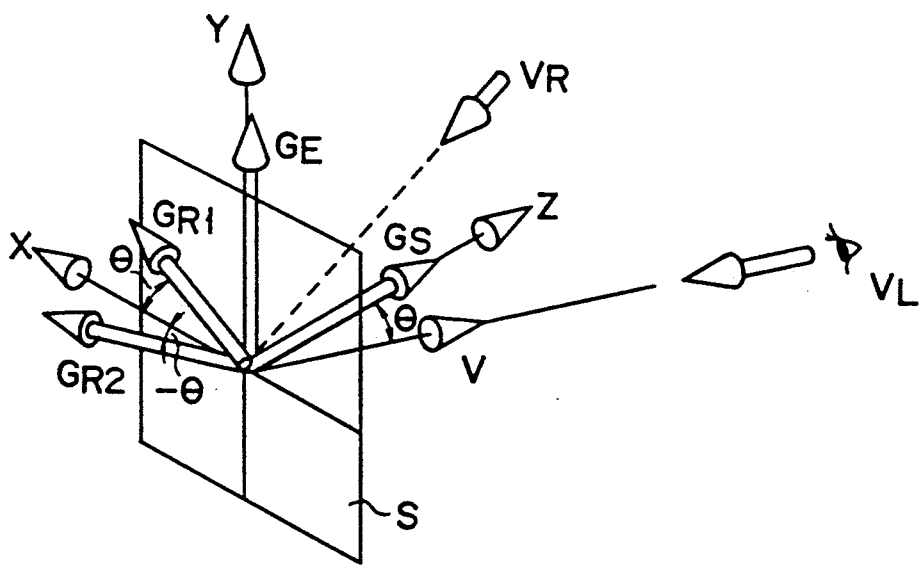
FIG. 12 is a view showing a gradient field direction and a view direction.

As shown in FIG. 12, the gradient fields $G_S$, $G_E$, and $G_R$ along the X-, Y-, and Z-axis perpendicular to each other are defined as follows:

$$G_S = G_Z \qquad (3)$$

$$G_E = G_y \qquad (4)$$

$$G_R = \cos\theta \cdot G_x + \sin\theta \cdot G_z \qquad (5)$$

wherein an angle $\theta$ is positive in a clockwise direction of the X- or Z-axis and negative in a counterclockwise direction thereof. The angle 8 is set by changing a ratio of $G_S$ to $G_R$. For example, the angle of viewing with a right eye is $-5°$, and the angle of viewing with a left eye is $+5°$.

FIG. 12 also shows gradient fields $G_{R1}$ and $G_{R2}$ in viewing with left and right eyes, respectively. When the angle $\theta$ of viewing is set as described above, an angle formed between the view direction $V_L$ of the left eye and the gradient field $G_S$ is set to be $\theta$. Therefore, an angle formed between the slice S and the view direction $V_L$ is set to be $\pi/2 - \theta$. Similarly, if $$G_R = \cos(-\theta) \cdot G_x + \sin(-\theta) \cdot G_z = \cos\theta \cdot G_x - \sin\theta \cdot G_z \qquad (6)$$

then an angle formed between the slice S and the view direction $V_R$ is $\pi/2 + \theta$.

The view directions $V_L$ and $V_R$ are set to form an angle $2\theta$ therebetween, which copes with the distance between the right and left eyes of the observer OB. That is, the view directions $V_L$ and $V_R$ can be set for a single slice S.

A spin echo method by a general SAS pulse sequence having a longer pulse repetition time $T_R$ and a significantly longer echo time $T_E$ than those of the conventional pulse sequence is used to acquire an MR signal. For example, assume a pulse sequence of $T_R = 2,000$ msec and $T_E = 250$ msec. Note that an MR signal acquisition time is within 10 msec to several tens msec.

When an echo time $T_{E1}$ for acquiring an MR signal corresponding to $V_R$ is set to be 240 msec, and an echo time $T_{E2}$ for acquiring an MR signal corresponding to $V_L$ is set to be 260 msec, a pulse sequence shown in FIG. 13 is executed.

The contrast of an MR image reconstructed by MR data obtained by a pulse sequence of $T_R = 2,000$ msec and $T_E = 240$ msec and a pulse sequence of $T_R = 2,000$ msec and $T_E = 260$ msec is almost equal to that of an MR image reconstructed by MR data obtained by the above pulse sequence (FIG. 13). The view directions are set as described above, and MR images from two directions can be simultaneously acquired from a single slice S. Therefore, the scan time can be reduced by ½.

Figure 14:
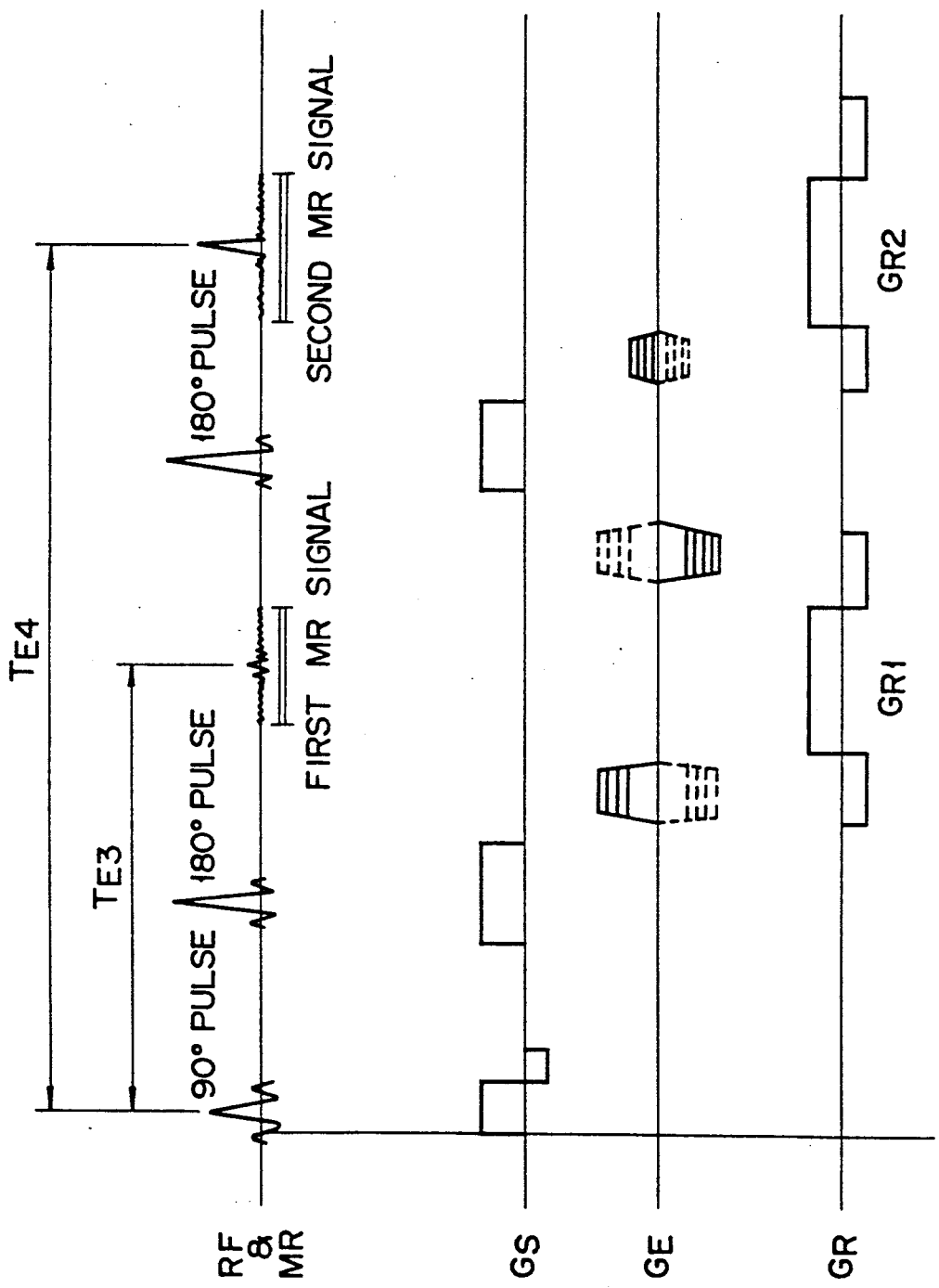
FIG. 14 is a view showing another pulse sequence by the spin echo method on the basis of the view direction shown in FIG. 11.

When the MR data acquisition time is shortened in the pulse sequence shown in FIG. 13, an S/N ratio of the MR image is decreased. Based on the fact that the second MR signal having a small phase encoding amount shown in FIG. 14 determines contrast of the MR image, the first MR signal having a large phase encoding amount is eliminated within a period except for the echo time $T_E$. Then, a decrease in S/N ratio can be prevented.

An operation for obtaining information in a direction of depth from a brain surface portion including a disease portion in an MR image acquired by SAS will be described below.

Figure 16:
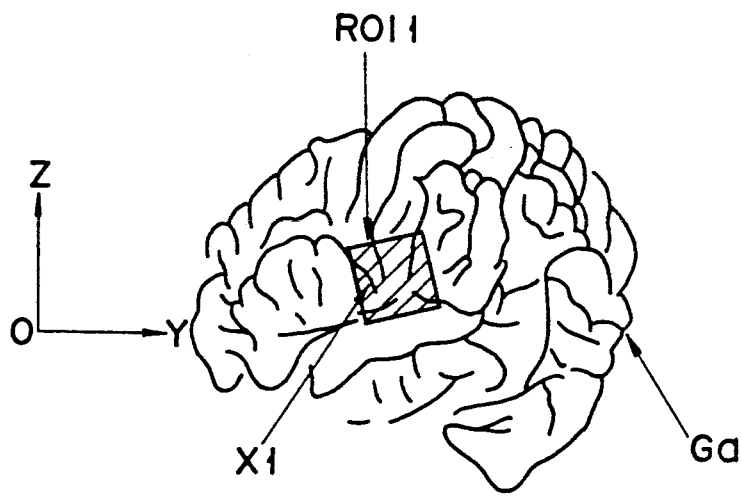
FIGS. 16 and 18 are views showing MR images of a brain surface and regions of interest set thereon.
Figure 18:
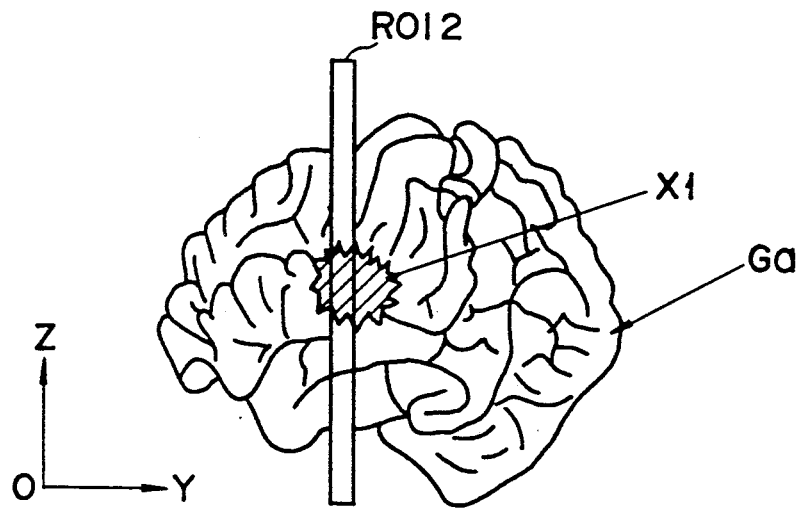

An MR image representing a brain surface is reconstructed by MR signals obtained by the pulse sequence of the spin echo method (FIG. 3) or a pulse sequence of an inversion recovery (IR) method (FIG. 15). In FIG. 15, $T_D$ is a delay time. As shown in FIGS. 16 and 18, an operator manipulates the keyboard 14 to set regions including a disease portion X1 as $ROI_1$ and $ROI_2$. The $ROI_1$ has a square size almost equal to the disease portion X1. The $ROI_2$ has a rectangular shape including part of the disease portion X1.

Position data of the $ROI_1$ or $ROI_2$ is output from the keyboard 14 to the sequence controller 10 through the process and control section 11. The controller 10 performs a scan for obtaining projection data of the $ROI_1$ (FIG. 17) or the $ROI_2$ (FIG. 19) in accordance with a predetermined pulse sequence.

Figure 21:
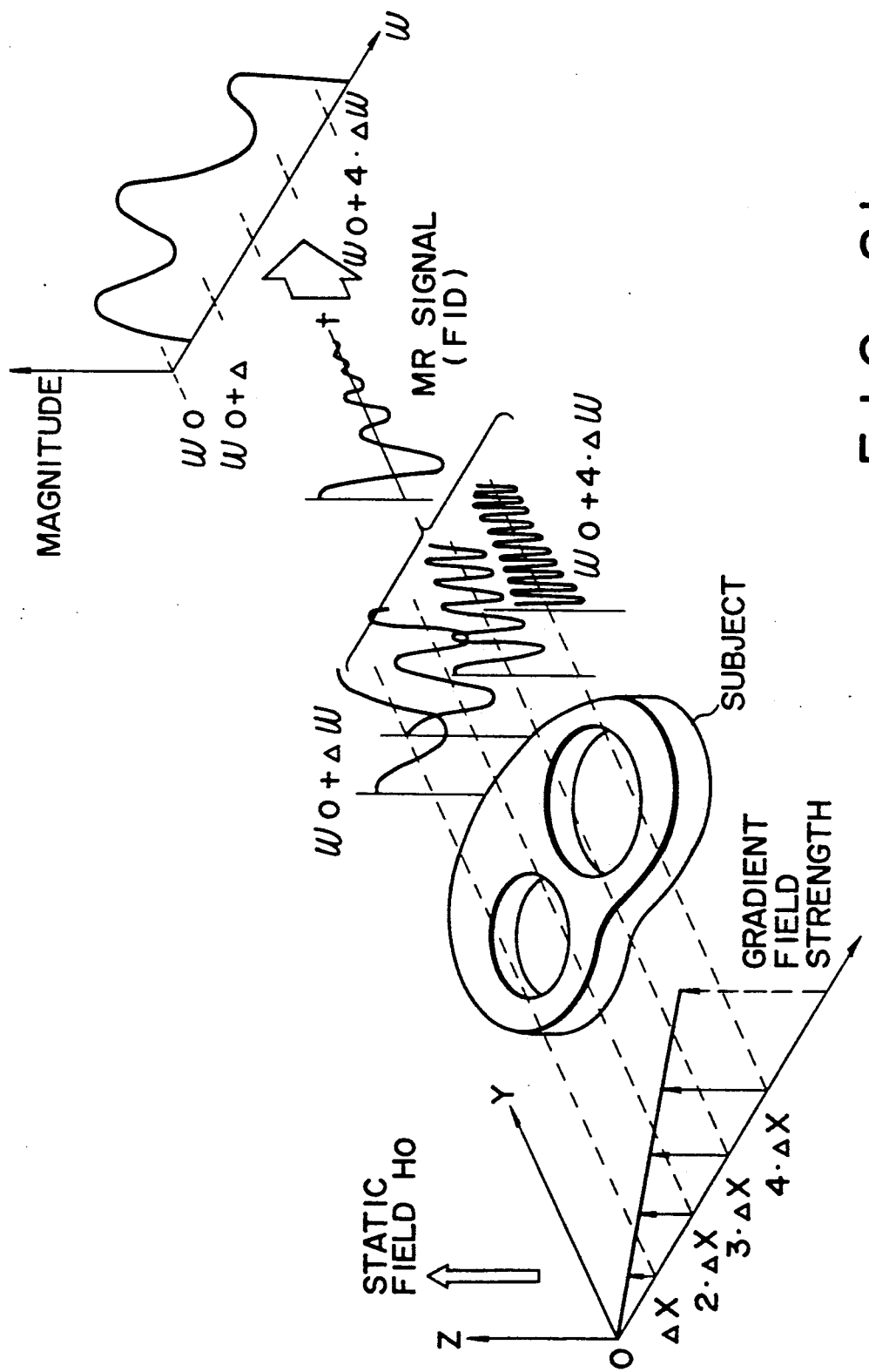
FIG. 21 is a view showing the process for acquiring the projection data.

This scan is performed as follows. A read gradient field ($G_x$) is applied by a pulse sequence of FIG. 20. The slicing gradient field ($G_y$ and $G_z$) are applied in directions perpendicular to each other, i.e., Y and Z directions, at the same time, 90° and 180° pulses are applied. An acquisition process of the MR signal by this scan is shown in FIG. 21. Referring to FIG. 21, a gradient field is applied to the subject such that an X-axis field strength is gradually increased by $\Delta x$, and signals having frequencies shifted by $\Delta w$ are acquired from the subject. These signals are synthesized to obtain an MR signal, and the MR signal is converted into an electrical signal. The electrical signal is then Fourier-transformed.

Figure 17:
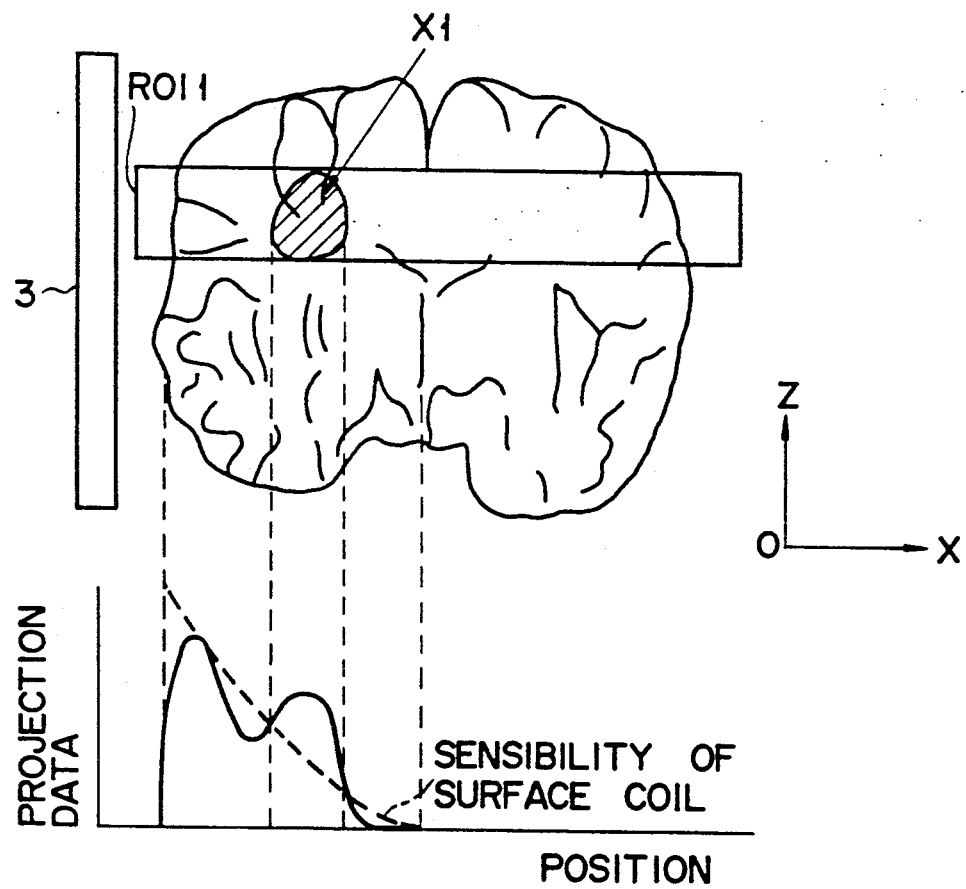
FIGS. 17 and 19 are views showing the regions of interest and changes in projection data in a direction of depth of a brain.
Figure 19:
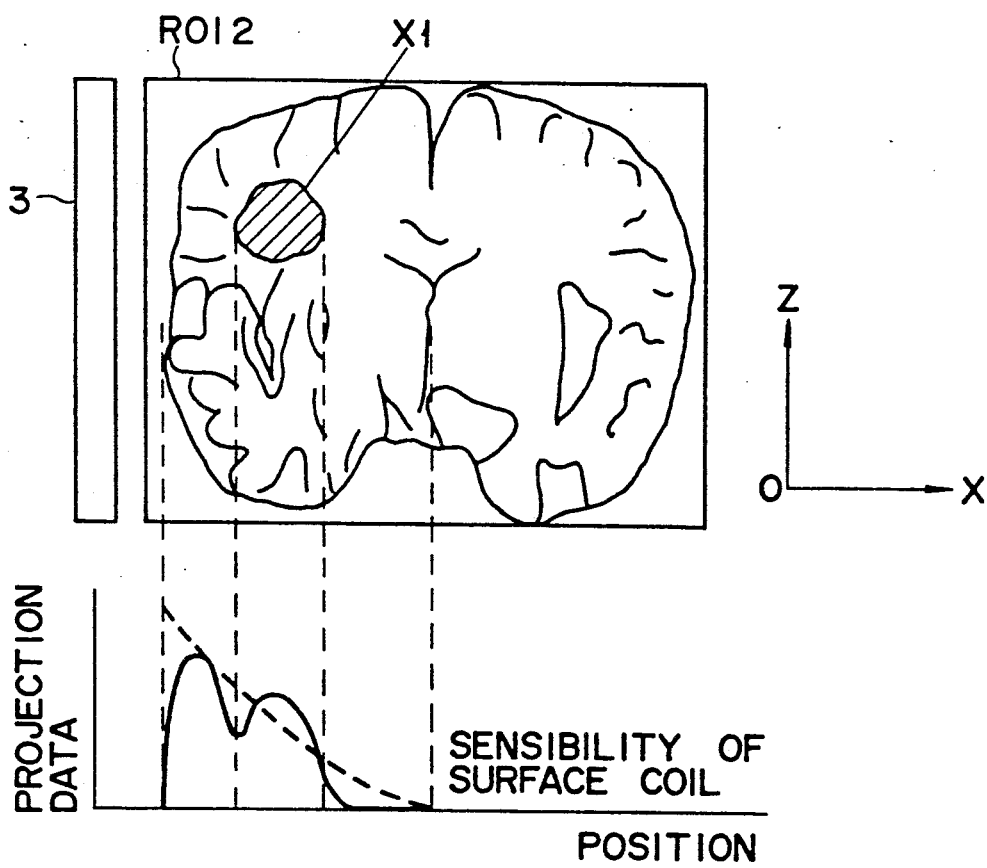
Figure 22:
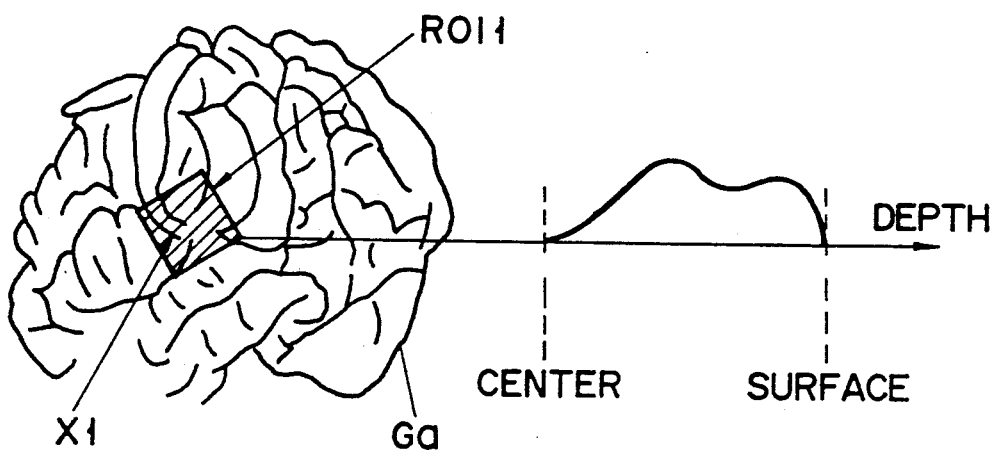
FIGS. 22 and 23 are display examples of the MR images and the projection data.

As shown in FIGS. 17 and 19, in the Fourier-transformed signal (corresponding to projection data), a signal magnitude corresponding to the disease portion X1 is larger than those of other portions. The position of the disease portion X1 corresponds to the frequency of the signal. When a position corresponding to the center of the brain is defined as an origin and a distance from the center to the brain surface is given as a distance corresponding to the frequency, the projection data is displayed, as shown in FIG. 22. At the same time, if an image Ga can also be displayed, a depth from the brain surface to the disease portion X1, which is represented by the projection data, and a position of the disease portion X1 on the brain surface of the image Ga can be easily grasped.

Figure 23:
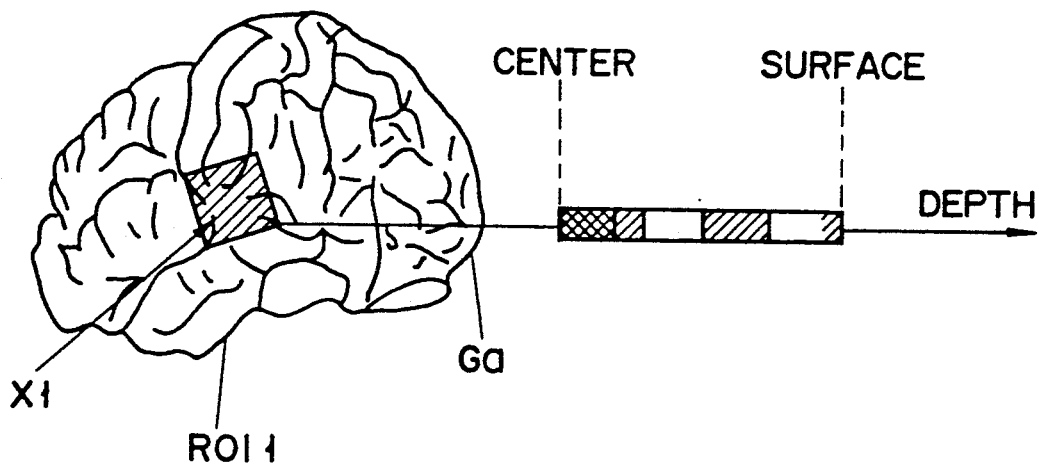

A display of projection data may be performed by using a gray scale bar shown in FIG. 23. In this case, a scale bar portion corresponding to the disease portion X1 or the like is white.

Projection data obtained by setting the $ROI_2$ shown in FIG. 18 can be acquired within the area including the disease portion X1 in the direction of depth, as shown in FIG. 19.

The projection data described above can be obtained by a single scan, and therefore the scan time can be greatly reduced.

The present invention has been described with reference to the particular embodiment described above. However, the present invention is not limited to the above embodiment, and various changes and modifications may be made within the spirit and scope of the invention.

What is claimed is:

1. A method for acquiring an image representing a brain surface anatomy of a subject in a magnetic resonance imaging apparatus, the method comprising the steps of:

arranging a surface coil near the head of the subject;
executing a predetermined pulse sequence for applying a static magnetic field, gradient magnetic fields, and a radio frequency pulse to the subject to obtain magnetic resonance signals from water of only a brain surface inside the head of the subject and to inhibit magnetic resonance signals from fat of the brain surface inside the head of the subject;
detecting the magnetic resonance signals from the water of only the brain surface inside the head of the subject using the surface coil in accordance with the predetermined pulse sequence; and
constructing an image representing the brain surface anatomy of the subject from the detected magnetic resonance signals.

2. The method according to claim 1, wherein the predetermined pulse sequence includes a pulse sequence corresponding to a field echo method.

3. The method according to claim 1, wherein the predetermined pulse sequence includes a pulse sequence corresponding to a field echo method using a chemical shift.

4. The method according to claim 1, wherein the predetermined pulse sequence includes the steps of:

applying an $\alpha(\alpha<90°)$ pulse to the head of the subject;
applying a first 180° pulse to the head of the subject;
applying a second 180° pulse to the head of the subject; and
detecting the magnetic resonance signals from the water of the brain surface inside the head of the subject.

5. The method according to claim 1, further comprising the steps of:

setting a region of interest on the constructed images;
obtaining projection data by executing another predetermined pulse sequence for the set region of interest; and
displaying the constructed images and the obtained projection data.

6. The method according to claim 1, wherein the predetermined pulse sequence is executed using an echo time for inhibiting the magnetic resonance signals from the fat of the brain surface inside the head of the subject.

7. The method according to claim 6, wherein the echo time is approximately 250 msec.

8. The method according to claim 1, wherein the predetermined pulse sequence is executed using a pulse repetition time for enhancing the magnetic resonance signals from the water of only the brain surface inside the head of the subject.

9. The method according to claim 8, wherein the pulse repetition time is approximately 2000 msec.

10. A method for acquiring an image representing a brain surface anatomy inside the head of a subject in a magnetic resonance imaging apparatus, the method comprising the steps of:

arranging a surface coil near the head of the subject;
executing a predetermined pulse sequence for applying a static magnetic field, gradient magnetic fields, and a radio frequency pulse to the subject to obtain magnetic resonance signals from water of only a brain surface inside the head of the subject and to inhibit magnetic resonance signals from fat of the brain surface inside the head of the subject;
setting view directions for a slice position of the head of the subject by controlling components of the gradient magnetic fields;
detecting said magnetic resonance signals corresponding to the set view directions from the water of only the brain surface inside the head of the subject using the surface coil in accordance with the predetermined pulse sequence; and constructing images representing the brain surface anatomy of the subject from the detected magnetic resonance signals to acquire a stereoscopic image in accordance with the constructed images.

11. A system for acquiring an image representing a brain surface anatomy inside a head of a subject in a magnetic resonance imaging apparatus, the system comprising:

static magnetic field applying means for applying a static magnetic field to the subject;

gradient magnetic field applying means for applying gradient magnetic fields to the subject;

surface coil means for transmitting a radio frequency pulse to the subject and detecting magnetic resonance signals from the subject, the surface coil means being arranged near the head of the subject;

pulse sequence control means for controlling the static magnetic field applying means, the gradient magnetic field applying means and the surface coil means in accordance with a predetermined pulse sequence to obtain the magnetic resonance signals from water of only a brain surface inside the head of the subject and to inhibit the magnetic resonance signals from fat of the brain surface inside the head of the subject; and processing means for processing the magnetic resonance signals detected by the surface coil means to produce an image representing the brain surface anatomy.

12. The system according to claim 11, wherein the predetermined pulse sequence includes a pulse sequence corresponding to a field echo method.

13. The system according to claim 11, wherein the predetermined pulse sequence includes a pulse sequence corresponding to a field echo method using a chemical shift.

14. A system for acquiring an image representing a brain surface anatomy inside a head of a subject in a magnetic resonance imaging apparatus, the system comprising:

static magnetic field applying means for applying a static magnetic field to the subject;

gradient magnetic field applying means for applying gradient magnetic fields to the subject;

surface coil means for transmitting a radio frequency pulse to the subject and detecting magnetic resonance signals from the subject, the surface coil means being arranged near the head of the subject;

setting means for setting view directions for a slice position of the head;

pulse sequence control means for controlling the static magnetic field applying means, the gradient magnetic field applying means and the surface coil means to obtain the magnetic resonance signals from water of only a brain surface inside the head of the subject and to inhibit the magnetic resonance signals from fat of the brain surface inside the head of the subject, corresponding to each of said set view directions; and processing means for processing the magnetic resonance signals detected by the surface coil means to produce a stereoscopic image representing the brain surface anatomy, wherein the view directions set by the setting means are set by controlling components of the gradient magnetic fields.

* * * * *

UNITED STATES PATENT AND TRADEMARK OFFICE
CERTIFICATE OF CORRECTION

PATENT NO. : 5,078,141

DATED : January 07, 1992

INVENTOR(S) : Hirokazu Suzuki et al.

It is certified that error appears in the above-identified patent and that said Letters Patent is hereby corrected as shown below:

Title page:

Item (54): Title, before "IMAGE" insert --AN--.

Abstract, line 10, before "using" insert --performed--.

Abstract, line 13, after "order" Delete --performed--.

Signed and Sealed this

Sixth Day of July, 1993

Attest:

MICHAEL K. KIRK

*Attesting Officer*  *Acting Commissioner of Patents and Trademarks*